(12) United States Patent
Cabanas-Holmen et al.

(10) Patent No.: US 8,054,099 B2
(45) Date of Patent: Nov. 8, 2011

(54) METHOD AND APPARATUS FOR REDUCING RADIATION AND CROSS-TALK INDUCED DATA ERRORS

(75) Inventors: Manuel F. Cabanas-Holmen, Roy, WA (US); Ethan H. Cannon, Sammamish, WA (US); Salim A. Rabaa, Shoreline, WA (US)

(73) Assignee: The Boeing Company, Chicago, IL (US)

( * ) Notice: Subject to any disclaimer, the term of this patent is extended or adjusted under 35 U.S.C. 154(b) by 317 days.

(21) Appl. No.: 12/511,207

(22) Filed: Jul. 29, 2009

(65) Prior Publication Data

US 2011/0025372 A1    Feb. 3, 2011

(51) Int. Cl.
H03K 19/003 (2006.01)
H03K 19/00 (2006.01)
G11C 11/00 (2006.01)

(52) U.S. Cl. .......................................... 326/12; 365/156
(58) Field of Classification Search ................ 326/9, 12, 326/13; 327/144, 197–202; 365/156, 189.05, 365/194
See application file for complete search history.

(56) References Cited

U.S. PATENT DOCUMENTS

| | | | | |
|---|---|---|---|---|
| 5,870,332 A * | 2/1999 | Lahey et al. | | 365/156 |
| 6,127,864 A * | 10/2000 | Mavis et al. | | 327/144 |
| 6,326,809 B1 | 12/2001 | Gambles et al. | | |
| 6,480,019 B2 * | 11/2002 | Waldie et al. | | 326/16 |
| 6,504,411 B2 | 1/2003 | Cartagena | | |
| 6,882,201 B1 * | 4/2005 | Koch et al. | | 327/199 |
| 7,269,057 B2 | 9/2007 | Haddad et al. | | |
| 7,482,831 B2 * | 1/2009 | Chakraborty et al. | | 326/12 |
| 7,590,907 B2 | 9/2009 | Drake et al. | | |
| 2001/0038304 A1 | 11/2001 | Waldie et al. | | |
| 2005/0265089 A1 * | 12/2005 | Lotz et al. | | 365/200 |
| 2007/0028157 A1 | 2/2007 | Drake et al. | | |
| 2007/0132496 A1 | 6/2007 | Kuboyama | | |
| 2008/0115023 A1 | 5/2008 | Carlson | | |
| 2009/0189634 A1 * | 7/2009 | Rezgui et al. | | 326/12 |

OTHER PUBLICATIONS

Naseer et al., "The DF-DICE Storage Element for Immunity to Soft Errors", Proceedings of the 48th IEEE International Midwest Symposium on Circuits and Systems, 2006, pp. 303-306.
Blum et al., "Comparison of SET-Resistant Approaches for Memory-Based Architectures", Proceedings of the 12th NASA Symposium VLSI Design, 2005, pp. 1-6.
"PrimeTime—Golden Timing SignOff Solution and Environment", Synopsys, pp. 1-5, retrieved Jun. 16, 2009 http://www.synopsys.com/Tools/Implementation/SignOff/Pages/PrimeTime.aspx.

(Continued)

Primary Examiner — Shawki S Ismail
Assistant Examiner — Dylan White
(74) Attorney, Agent, or Firm — Yee & Associates, P.C.

(57) ABSTRACT

The different advantageous embodiments provide an integrated circuit comprising a number of latches and a number of filters. Each latch in the number of latches has a plurality of inputs and a plurality of storage nodes. The plurality of storage nodes includes a number of pairs of circuit nodes that form a number of upsettable circuit node pairs. Each input of the plurality of inputs is connected to a corresponding storage node in the plurality of storage nodes. Each filter in the number of filters has an input and a plurality of outputs. Each of the plurality of outputs is connected to a corresponding input of the plurality of inputs of a latch in the number of latches. Each filter in the number of filters is located between two circuit nodes forming an upsettable circuit node pair of the latch in the number of latches to increase critical node spacing.

7 Claims, 9 Drawing Sheets

OTHER PUBLICATIONS

"PrimeTime—Golden Timing SignOff Solution and Environment", Synopsys Datasheet, pp. 1-6, retrieved Jun. 16, 2009 http://www.synopsys.com/Tools/Implementation/SignOff/Documents/primetime_suite_ds.pdf.

"CeltIC", Cadence Datasheet, pp. 1-2 retrieved Jun. 16, 2009 http://w2.cadence.com/datasheets/3073E_CeltIC_DS_Fnl.pdf.

Li, Uyhong et al., "Low Power Dissipation SEU-hardened CMOS Latch", PIERS Online, vol. 3, No. 7, 2007, pp. 1080-1084.

USPTO office action for U.S. Appl. No. 13/015331 dated Mar. 4, 2011.

EP Search report for application EP10251339 dated Dec. 20, 2010.

\* cited by examiner

METHOD AND APPARATUS FOR REDUCING RADIATION AND CROSS-TALK INDUCED DATA ERRORS

BACKGROUND INFORMATION

This invention was made with Government support under NR0000-06-C-0248 awarded by the United States National Reconnaissance Office. The Government has certain rights in this invention.

1. Field

The present disclosure relates generally to the data processing field, and more particularly to a method and apparatus for reducing data errors caused by radiation particle strikes in integrated circuits.

2. Background

Spacecraft, such as satellites, space stations, space shuttles, rockets, and the like may have various operational systems. These operational systems may include systems for navigation and communication, and other environmental systems used for operating and protecting a spacecraft in space. Each of these operational systems may include computers, processors, controllers, and other electronic equipment that comprise integrated circuits.

Radiation particles such as cosmic rays, protons trapped in the Van Allen belts, and particles from solar particle events can cause errors in integrated circuits. Radiation particle strikes can cause single event effects that upset storage circuits, register bits, and latches. These events are known as single event upsets (SEU). Radiation particle strikes in logic gates can create voltage transients, known as single event transients (SETs), that may be latched by storage circuits and cause a single event upset. Single event upsets can cause incorrect output or incorrect operation of an integrated circuit. This incorrect output or incorrect operation of an integrated circuit can lead to inconsistencies or incorrect behavior in the operation systems of a spacecraft, for example, such as loss of communication capability, corruption of transmitted or received data, or misguided navigation into an undesired orbit.

Therefore, it would be advantageous to have a method and apparatus that takes into account one or more of the issues described above as well as possibly other issues.

SUMMARY

Thus, one or more of the different advantageous embodiments may provide an integrated circuit comprising a number of latches and a number of filters. Each latch in the number of latches has a plurality of inputs and a plurality of storage nodes. The plurality of storage nodes includes a number of pairs of circuit nodes that form a number of upsettable circuit node pairs. Each input of the plurality of inputs is connected to a corresponding storage node in the plurality of storage nodes. Each filter in the number of filters has an input and a plurality of outputs. Each of the plurality of outputs is connected to a corresponding input of the plurality of inputs of a latch in the number of latches. Each filter in the number of filters is located between two circuit nodes forming an upsettable circuit node pair of the latch in the number of latches to increase critical node spacing.

The different advantageous embodiments may further provide an integrated circuit comprising a number of dual interlocked storage cell flip-flops and a number of temporal filters. Each of the number of dual interlocked storage cell flip-flops has two inputs and four storage nodes. The four storage nodes include a number of pairs of circuit nodes that form a number of upsettable circuit node pairs. A first two of the four storage nodes comprise a master dual interlocked storage cell latch and a second two of the four storage nodes comprise a slave dual interlocked storage cell latch. The number of temporal filters has two outputs. Each of the two outputs is connected to two inputs of a dual interlocked storage cell flip-flop in the number of dual interlocked storage cell flip-flops. Each input of the two inputs is connected to a corresponding storage node in the first two storage nodes of the master dual interlocked storage cell latch of the dual interlocked storage cell flip-flop. The number of temporal filters is physically located between a pair of circuit nodes in the number of pairs of circuit nodes forming the number of upsettable circuit node pairs within the dual interlocked storage cell flip-flop to increase critical node spacing.

The different advantageous embodiments may further provide a method for reducing data errors. A data signal is received. A first portion of the data signal is sent onto a first input path in a filter. The first input path comprises a first input of a first C-gate and a first input of a second C-gate. A second portion of the data signal is sent onto a second input path in the filter. The second input path comprises a number of delay elements in series with the first C-gate and the second C-gate. The second portion of the signal travels through the number of delay elements into a second input of the first C-gate and a second input of the second C-gate.

The features, functions, and advantages can be achieved independently in various embodiments of the present disclosure or may be combined in yet other embodiments in which further details can be seen with reference to the following description and drawings.

BRIEF DESCRIPTION OF THE DRAWINGS

The novel features believed characteristic of the advantageous embodiments are set forth in the appended claims. The advantageous embodiments, however, as well as a preferred mode of use, further objectives and advantages thereof, will best be understood by reference to the following detailed description of an advantageous embodiment of the present disclosure when read in conjunction with the accompanying drawings, wherein:

DETAILED DESCRIPTION

Figure 1:
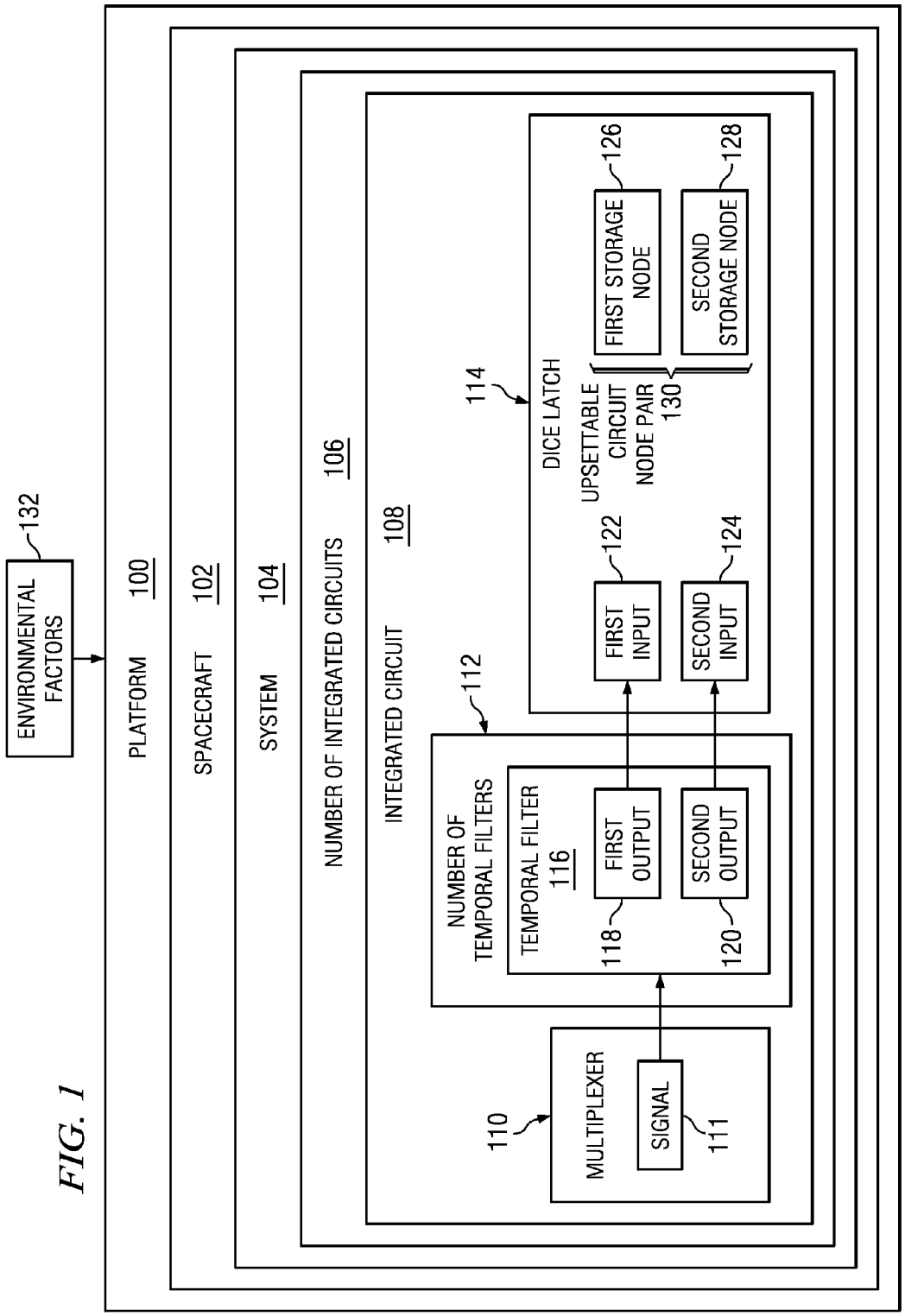
FIG. 1 is an illustration of a platform in which an advantageous embodiment may be implemented.

The different advantageous embodiments recognize and take into account a number of different considerations. For example, the different advantageous embodiments recognize and take into account that currently used methods for reducing circuit sensitivity use spatial and temporal redundancy techniques. An example of spatial redundancy may be the Triple Modular Redundancy (TMR) technique, which involves triplicating a flip-flop and voting on the output of the three copies. A flip-flop refers to an electronic circuit, or bistable multivibrator, having two states and capable of serving as one bit of memory. A flip-flop may be controlled by one or more control signals and/or a gate or clock signal. As a result, non-transparent, or clocked, devices are usually referred to as flip-flops. A transparent device is typically referred to as a latch. With the Triple Modular Redundancy (TMR) technique, a single event upset in one flip-flop is ignored by the voting scheme.

Dual interlocked storage cell (DICE) flip-flops may be another example of spatial redundancy. A DICE flip-flop duplicates the internal nodes of a flip-flop so that a radiation particle strike on one node cannot upset the flip-flop. However, these current spatial redundancy schemes can be defeated by radiation particle events that affect multiple nodes, such as, for example, a radiation particle that upsets two flip-flops in a Triple Modular Redundancy (TMR) scheme, or a radiation particle that affects both copies of a node in a DICE flip-flop. Achieving acceptable single event upset rates requires adequate separation of susceptible nodes.

The different advantageous embodiments further recognize and take into account that currently used temporal redundancy schemes involve comparing a signal with time-delayed copies of the signal. For example, a temporal filter sends a signal with a time-delayed copy of the signal to a tristatable inverter or C-gate. If the inputs agree, the C-gate passes the signal. If the inputs do not agree, such as in the case of a single event transient, the C-gate outputs a signal that is neither driven to a logical high nor low level, and thus is tri-stated. The signal that had been passed forward by the C-gate before the single event transient occurred is maintained at the same logic level by node capacitance.

The different advantageous embodiments further recognize and take into account that current methods for solving signal integrity concerns from cross-talk, or transient noise, require separate and special tools that try to solve the noise glitches generated by cross coupled signals. One current approach is to identify certain signals and either increase wire separation or change the drive size of the aggressor line or the victim line. These changes may be very difficult in complex integrated circuits. Cross-talk occurs where noise or a switching transition on one metal wiring line is coupled to another metal wiring line. As integrated circuit dimensions become smaller with the scaling of semiconductor processes to smaller lithographic nodes, cross-talk is a growing concern in current methods of reducing circuit sensitivity.

The different advantageous embodiments further recognize and take into account that the current methods for single event upset mitigation have power, speed, and area penalties. The Triple Modular Redundancy (TMR) scheme requires three flip-flops and a voter, in lieu of a single flip-flop, which results in an area and power increase of more than a factor of three, and a speed delay due to the time delay imposed by the voter. Power is a critical integrated circuit parameter, as it impacts operating costs through electricity use and the required cooling techniques. Furthermore, in space applications, available power may be limited. Additionally, larger integrated circuits may have smaller manufacturing yield.

The different advantageous embodiments further recognize and take into account that current methods of inserting temporal filters post-synthesis complicates the design flow of complex integrated circuits. Many existing tools for adding temporal filters have no smart or automated method of inserting these filters. Adding temporal filters requires direct intervention by the designer post-synthesis and post-place and route. The timing of this addition means the temporal filters are added after balancing clock trees and meeting setup and hold times. With parasitic loads becoming an increasing factor in ever smaller semiconductor processes, balancing the clock tree and meeting timing becomes much harder to achieve when existing tools must incorporate temporal filtering into their calculations.

Thus, one or more of the different advantageous embodiments may provide an integrated circuit comprising a number of latches and a number of filters. Each latch in the number of latches has a plurality of inputs and a plurality of storage nodes. The plurality of storage nodes includes a number of pairs of circuit nodes that form a number of upsettable circuit node pairs. Each input of the plurality of inputs is connected to a corresponding storage node in the plurality of storage nodes. Each filter in the number of filters has an input and a plurality of outputs. Each of the plurality of outputs is connected to a corresponding input of the plurality of inputs of a latch in the number of latches. Each filter in the number of filters is located between two circuit nodes forming an upsettable circuit node pair of the latch in the number of latches to increase critical node spacing.

The different advantageous embodiments provide a transient-tolerant scannable dual interlocked storage cell (DICE) latch with increased radiation tolerance that is easy to implement. The different advantageous embodiments protect against radiation particle strikes to the C-gates of a temporal filter and a data/scan multiplexer that would be unprotected in current methods where the temporal filter is external to the dual interlocked storage cell.

The different advantageous embodiments further provide a method for increasing node spacing of circuit nodes forming an upsettable circuit node pair to further reduce single event upset sensitivity using temporal filters. When the temporal filters are incorporated in the dual interlocked storage cells, the parasitic loads are controlled. The different advantageous embodiments provide a method and apparatus that avoids problems arising from post-synthesis filter insertion and mitigates transients within a stand-alone cell. Thus, the different advantageous embodiments provide a method and apparatus that mitigates the risk of single event upsets from radiation particles.

As used herein, the phrase "at least one of", when used with a list of items, means that different combinations of one or more of the items may be used and only one of each item in the list may be needed. For example, "at least one of item A, item B, and item C" may include, for example, without limitation, item A or item A and item B. This example also may include item A, item B, and item C or item B and item C.

With reference now to the figures, and in particular FIG. 1, an illustration of a platform is depicted in which an advantageous embodiment may be implemented. Platform 100 may be any type of platform incorporating integrated circuits that may encounter sensitivity to single event effects, such as, for example, without limitation, single event upsets and single event transients, and/or sensitivity to cross-talk noise. Platform 100 may include, for example, without limitation, a spacecraft, satellite, aircraft, missile, submarine, tank, and/or any other platform that may incorporate integrated circuits. These events may cause platform 100 to perform at a lower level than desired.

Spacecraft 102 is an illustrative example of one embodiment of platform 100. Platform 100 may include a system, such as system 104 of spacecraft 102, which incorporates number of integrated circuits 106. Number of integrated circuits 106 may refer to any type of electronic circuit that has been manufactured in the surface of a substrate of a semiconductor material. As used herein, number refers to one or more items. For example, number of integrated circuits 106 may refer to one integrated circuit, and/or two or more integrated circuits.

Integrated circuit 108 may be an illustrative example of one embodiment of number of integrated circuits 106. Integrated circuit 108 may include multiplexer 110, number of temporal filters 112, and dual interlocked storage cell (DICE) latch 114. Multiplexer 110 may receive multiple input signals or data streams and select and/or combine the multiple inputs received into a single signal 111. Multiplexer 110 may send signal 111 to temporal filter 116.

Temporal filter 116 may be an example of one implementation of number of temporal filters 112. Temporal filter 116 receives signal 111 from multiplexer 110 and provides two data outputs, first output 118 and second output 120. First output 118 and second output 120 are generated at the same time.

Dual interlocked storage cells are storage devices that duplicate the internal storage nodes of a latch. The internal storage nodes must have the same new logic value at the same time for the new value to be stored in the dual interlocked storage cell (DICE) latch. First output 118 may be received by dual interlocked storage cell (DICE) latch 114 at first input 122. Second output 120 may be received by dual interlocked storage cell (DICE) latch 114 at second input 124. First input 122 and second input 124 are connected to first storage node 126 and second storage node 128. First storage node 126 and second storage node 128 form upsettable circuit node pair 130.

In a dual interlocked storage cell (DICE) latch there are multiple pairs of circuit nodes that may cause the dual interlocked storage cell (DICE) latch to upset if both nodes experience a particle strike at the same time. An upset may refer to flipping states, or changing from state "0" to state "1", in response to something other than input signals. These multiple pairs of circuit nodes form upsettable circuit node pairs. Circuit nodes form an upsettable circuit node pair when the logical connection between circuit nodes is such that a radiation event on both circuit nodes can upset the dual interlocked storage cell latch. Upsettable circuit node pairs can be determined by performing circuit simulations on the dual interlocked storage cell latch with electrical perturbations applied to pairs of circuit nodes. If the dual interlocked storage cell latch upsets with the application of the electrical perturbation, the two circuit nodes form an upsettable circuit node pair. If the dual interlocked storage cell latch does not upset the circuit, nodes do not form an upsettable circuit node pair.

Each circuit node is electrically connected to each of the internal storage nodes of a dual interlocked storage cell latch. The physical distance between each circuit node in a pair of upsettable circuit nodes is called critical node spacing. A pair of upsettable circuit nodes in a dual interlocked storage cell (DICE) latch 114 may be physically separated by temporal filter 116 to increase critical node spacing.

Environmental factors 132 may affect the integrity of the data and/or operations of number of integrated circuits 106. Environmental factors 132 may include, for example, without limitation, radiation particles, cosmic rays, protons trapped in the Van Allen belts, solar particles, cross-talk, and/or any other suitable environmental factor that may cause a single event effect such as single event upset and/or single event transient. Temporal filter 116 may be used to mitigate the effect of environmental factors 132 on the data and/or operations of integrated circuit 108 by increasing critical node spacing of circuit nodes forming upsettable circuit node pair 130.

The illustration of platform 100 in FIG. 1 is not meant to imply physical or architectural limitations to the manner in which different advantageous embodiments may be implemented. Other components in addition and/or in place of the ones illustrated may be used. Some components may be unnecessary in some advantageous embodiments. Also, the blocks are presented to illustrate some functional components. One or more of these blocks may be combined and/or divided into different blocks when implemented in different advantageous embodiments.

For example, in one advantageous embodiment, integrated circuit 108 may have a number of temporal filters. In this example, the number of temporal filters may be connected to both multiplexer 110 and a clock signal of integrated circuit 108. In another advantageous embodiment, integrated circuit 108 may be implemented with a dual interlocked storage cell (DICE) flip-flop having a master DICE latch, a slave DICE latch, and four storage nodes, for example.

Figure 2:
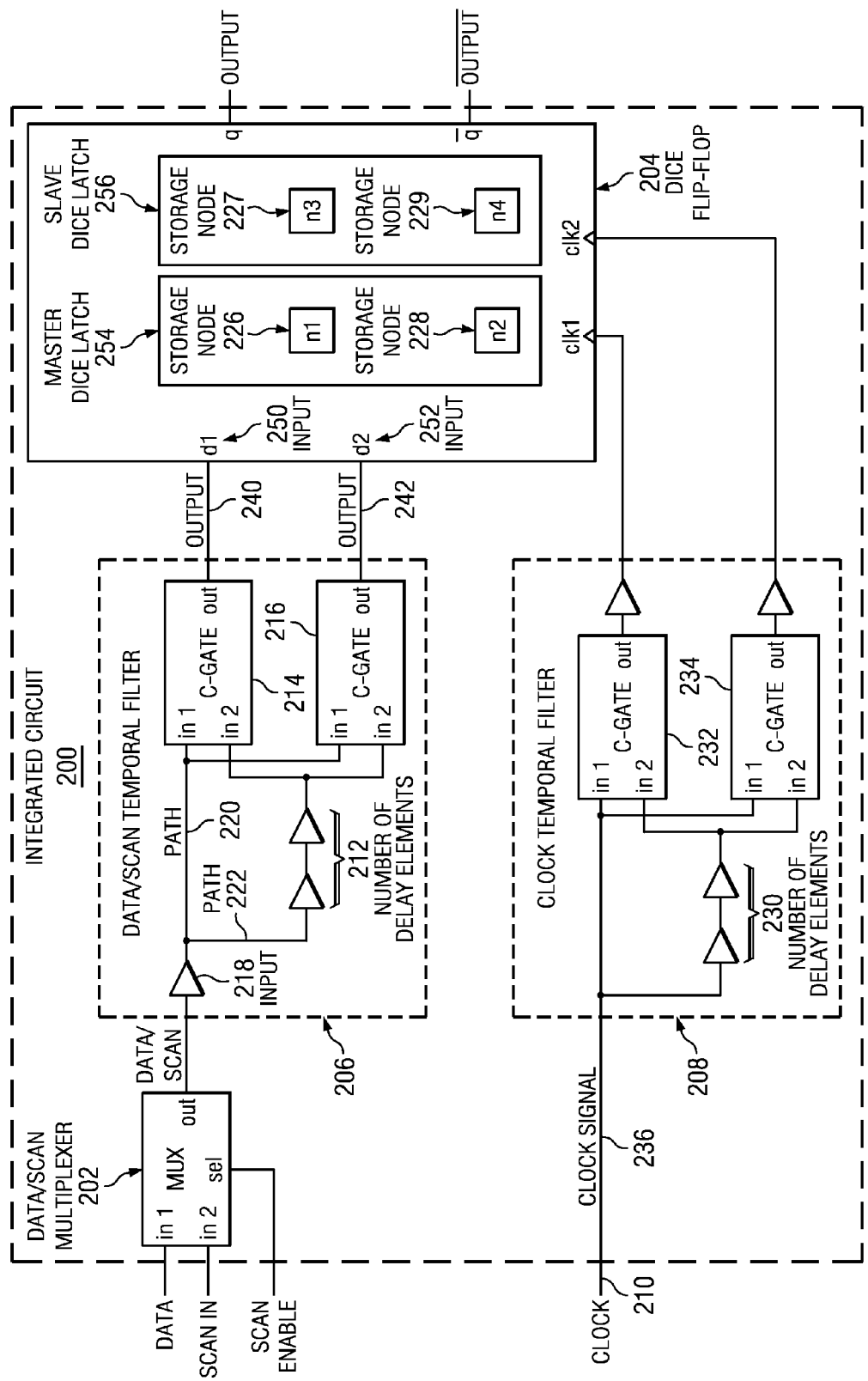
FIG. 2 is an illustration of integrated circuit in accordance with an advantageous embodiment.

With reference now to FIG. 2, an illustration of an integrated circuit is depicted in accordance with an advantageous embodiment. Integrated circuit 200 may be an example of one implementation of integrated circuit 108 on platform 100 in FIG. 1.

Integrated circuit 200 includes data/scan multiplexer 202, dual interlocked storage cell (DICE) flip-flop 204, data/scan temporal filter 206, clock temporal filter 208, and clock 210. Data/scan multiplexer 202 may be any type of device that performs multiplexing. Multiplexing may refer to the process of receiving multiple input signals or data streams and selecting and/or combining the multiple inputs received into a single signal over a shared medium. In one illustrative example, data/scan multiplexer 202 may select one of multiple inputs received to forward into a single line output. In another illustrative example, data/scan multiplexer 202 may combine multiple inputs received into a single signal output.

Dual interlocked storage cell (DICE) flip-flop 204 is used as a storage device in these examples. Dual interlocked storage cell (DICE) flip-flop 204 may be implemented using any electronic circuit, which has two stable states and can store one bit of information, such as a bi-stable multivibrator for example. A flip-flop may refer to a non-transparent, or clocked, storage device, for example.

Data/scan temporal filter 206 includes number of delay elements 212, C-gate 214, and C-gate 216. Number of delay elements 212 may include, for example, without limitation, an inverter, a current-starved inverter, a pass gate, and/or any other suitable delay element. Number of delay elements 212 is configured to be adjusted to change the time needed for a signal to reach a C-gate, such as C-gate 214, and C-gate 216. Adjusting the delay of number of delay elements 212 in data/scan temporal filter 206 can either increase or decrease the tolerance of dual interlocked storage cell (DICE) flip-flop 204 to transients.

Transients are short-lived oscillations that may be caused by a sudden change in voltage, current, or load. Transients may be latched by storage circuits, such as dual interlocked storage cell (DICE) flip-flop 204, causing an upset. If a transient occurs that is shorter than the set time delay of number of delay elements 212, the outputs of C-gate 214 and C-gate 216 of data/scan temporal filter 206 are not driven to a logical high or low, and the transient value cannot be latched in dual interlocked storage cell (DICE) flip-flop 204. If a transient occurs that is longer than the set time delay, and clock signal 236 is high, the transient may still be captured. The ability to adjust the time delay of number of delay elements 212 provides for improved mitigation of transients.

Environmental factors, such as environmental factors 132 in FIG. 1, can create transients that may cause incorrect output and/or operation of integrated circuit 200. The delay of data/scan temporal filter 206 may affect the performance of integrated circuit 200 using dual interlocked storage cell (DICE) flip-flop 204. The number of delay elements 212 may be adjusted to balance single event upset mitigation and integrated circuit performance.

C-gates 214 and 216 may be any type of tristatable inverter, including, without limitation, complementary metal oxide semiconductor (CMOS) tristatable inverter, n-channel metal oxide semiconductor (NMOS) tristatable inverter, p-channel metal oxide semiconductor (PMOS) tristatable inverter, and/or any other suitable tristatable inverter, for example.

Input 218 is received from data/scan multiplexer 202 and split into two paths by data/scan temporal filter 206. Path 220 sends the signal received directly to C-gate 214 and C-gate 216. Path 222 sends the signal received through number of delay elements 212 before the signal reaches C-gate 214 and C-gate 216. As a result, two outputs result from the single input 218 into temporal filter 206. C-gate 214 sends output 240 to input 250 of DICE flip-flop 204. C-gate 216 sends output 242 to input 252 of DICE flip-flop 204. Input 250 connects to storage node 226, and input 252 connects to storage node 228. Storage node 226 and storage node 228 are examples of one implementation of an upsettable circuit node pair, such as upsettable circuit node pair 130 in FIG. 1. Storage node 226 and storage node 228 are implemented as storage nodes of master dual interlocked storage cell (DICE) latch 254. Storage node 226 connects to storage node 227, and storage node 228 connects to storage node 229. Storage node 227 and storage node 229 are implemented as storage nodes of slave dual interlocked storage cell (DICE) latch 256. Storage node 227 and storage node 229 may be another illustrative example of one implementation of an upsettable circuit node pair. The different advantageous embodiments provide two C-gates, such as C-gate 214 and C-gate 216, which send their outputs to two independent inputs of DICE flip-flop 204, such as input 250 and input 252. As a result, a single event transient created by a radiation event in one C-gate, such as C-gate 214, only affects one input, such as input 250, and thus one storage node, storage node 226. In currently used applications, a temporal filter is placed external to integrated circuit 200. The temporal filter has a single output, which connects to data/scan multiplexer 202, and the output of data/scan multiplexer 202 would connect directly to DICE flip-flop 204 inputs 250 and 252. Consequently, a radiation event in the C-gate in the temporal filter or a radiation event in the data/scan multiplexer would create a single event transient that affects both storage nodes 226 and 228 of DICE flip-flop 204, which can upset DICE flip-flop 204 in current applications.

In this advantageous embodiment, output 240 and output 242 are interlocked with the storage nodes of master dual interlocked storage cell (DICE) latch 254 of dual interlocked storage cell (DICE) flip-flop 204, storage node 226 and storage node 228. If a single C-gate, such as C-gate 214, is affected by an environmental factor, such as a radiation particle strike, the generated transient would affect only one of the storage nodes, storage node 226. In this example, dual interlocked storage cell (DICE) flip-flop 204 would maintain its previously stored value. Additionally, data/scan temporal filter 206 increases critical node spacing between the upsettable node pair of storage node 226 and storage node 228. As such, dual interlocked storage cell (DICE) flip-flop 204 is transient tolerant and protected against single event transients on data/scan temporal filter 206.

In this illustrative example, if data/scan multiplexer 202 is affected by an environmental factor, such as a radiation particle strike, the generated transient would be removed by data/scan temporal filter 206. Thus, data/scan temporal filter 206 mitigates single event transients in data/scan multiplexer 202.

In one advantageous embodiment, clock temporal filter 208 receives clock signal 236 from clock 210 before clock signal 236 reaches DICE flip-flop 204. The clock temporal filter blocks any clock transients shorter than the filter delay, but it passes clock transients larger than the delay in the filter. Clock temporal filter 208 may include number of delay elements 230, C-gate 232, and C-gate 234. In one illustrative example, dual interlocked storage cell (DICE) flip-flop 204 may be designed for a time-discrete system. A device for a time-discrete system ignores inputs except for at the transition of a dedicated clock signal, such as clock signal 236 for example. In this illustrative example, at the transition caused by clock signal 236, dual interlocked storage cell (DICE) flip-flop 204 will either change or retain its output signal based on the values of the input signals at the transition. Dual interlocked storage cell (DICE) flip-flop 204 may change its output either on the rising edge or the falling edge of clock signal 236. Clock temporal filter 208 may also increase critical node spacing between upsettable node pairs.

In one advantageous embodiment, dual interlocked storage cell (DICE) flip-flop 204 may be implemented as a master-slave device, where interlocked nodes of two basic latches collaborate to reduce sensitivity to spikes and noise between short clock transitions. In another advantageous embodiment, dual interlocked storage cell (DICE) flip-flop 204 may include asynchronous inputs to clear and/or set the current output independent of clock 210, for example.

The illustration of integrated circuit 200 in FIG. 2 is not meant to imply physical or architectural limitations to the manner in which different advantageous embodiments may be implemented. Other components in addition and/or in place of the ones illustrated may be used. Some components may be unnecessary in some advantageous embodiments. Also, the blocks are presented to illustrate some functional components. One or more of these blocks may be combined and/or divided into different blocks when implemented in different advantageous embodiments.

For example, in one advantageous embodiment, integrated circuit 200 may be implemented without clock temporal filter 208. In another advantageous embodiment, integrated circuit 200 may be implemented with a scannable DICE master-slave flip-flop, where the master stage consists of a transient tolerant, scannable DICE latch with a data/scan multiplexer, and a second temporal filter in the clock input, and the slave stages consists of a DICE latch. In yet another advantageous embodiment, integrated circuit 200 may be implemented with a non-scannable master-slave flip-flop without data/scan multiplexer 202, for example. In still another advantageous embodiment, integrated circuit 200 may be implemented with a transient-tolerant, scannable DICE latch that is not part of a master/slave flip-flop, for example.

In another illustrative example, the advantageous embodiments may be implemented in a Triple Modular Redundancy (TMR) scheme. In this example, data/scan temporal filter 206 may have three C-gates, which provide three outputs. The three outputs in this example may be logically connected to three separate latches which are not interlocked, or connected, for example.

Figure 3A:
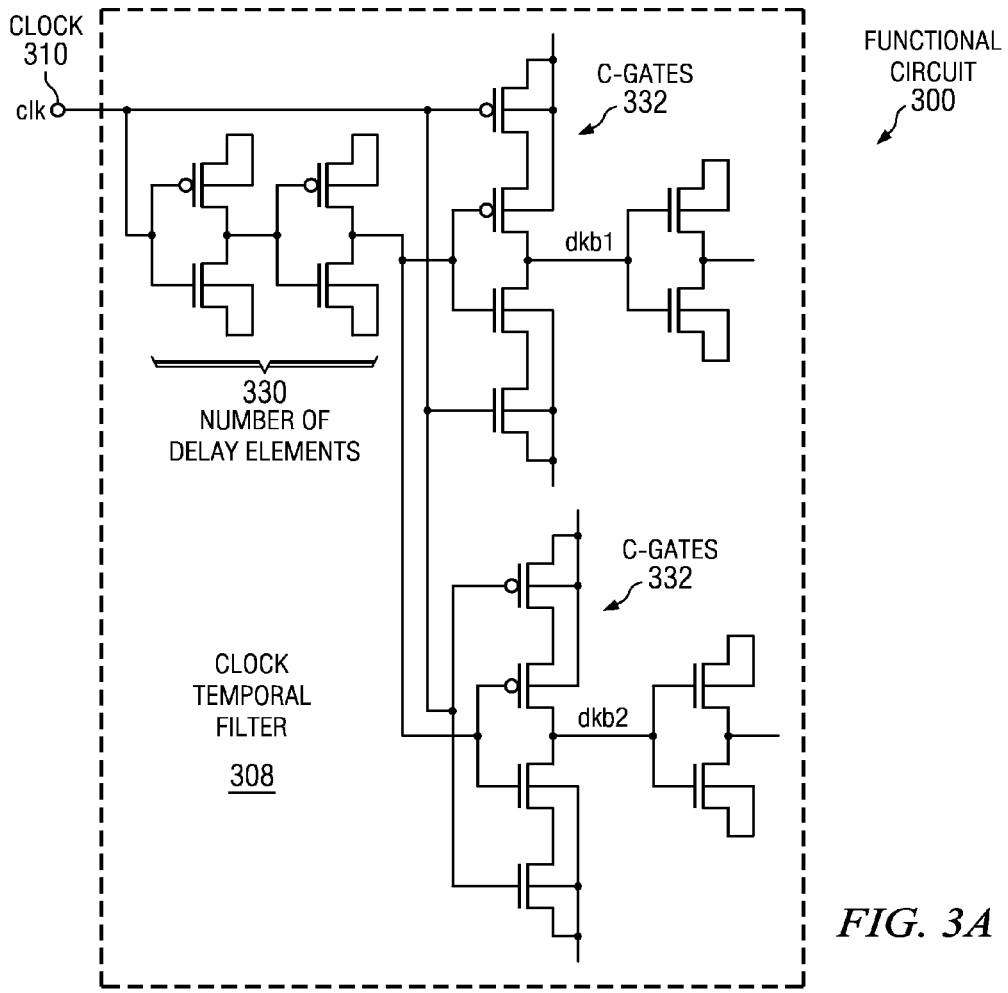
FIGS. 3A, 3B, and 3C are an illustration of a functional circuit in accordance with an advantageous embodiment.
Figure 3B:
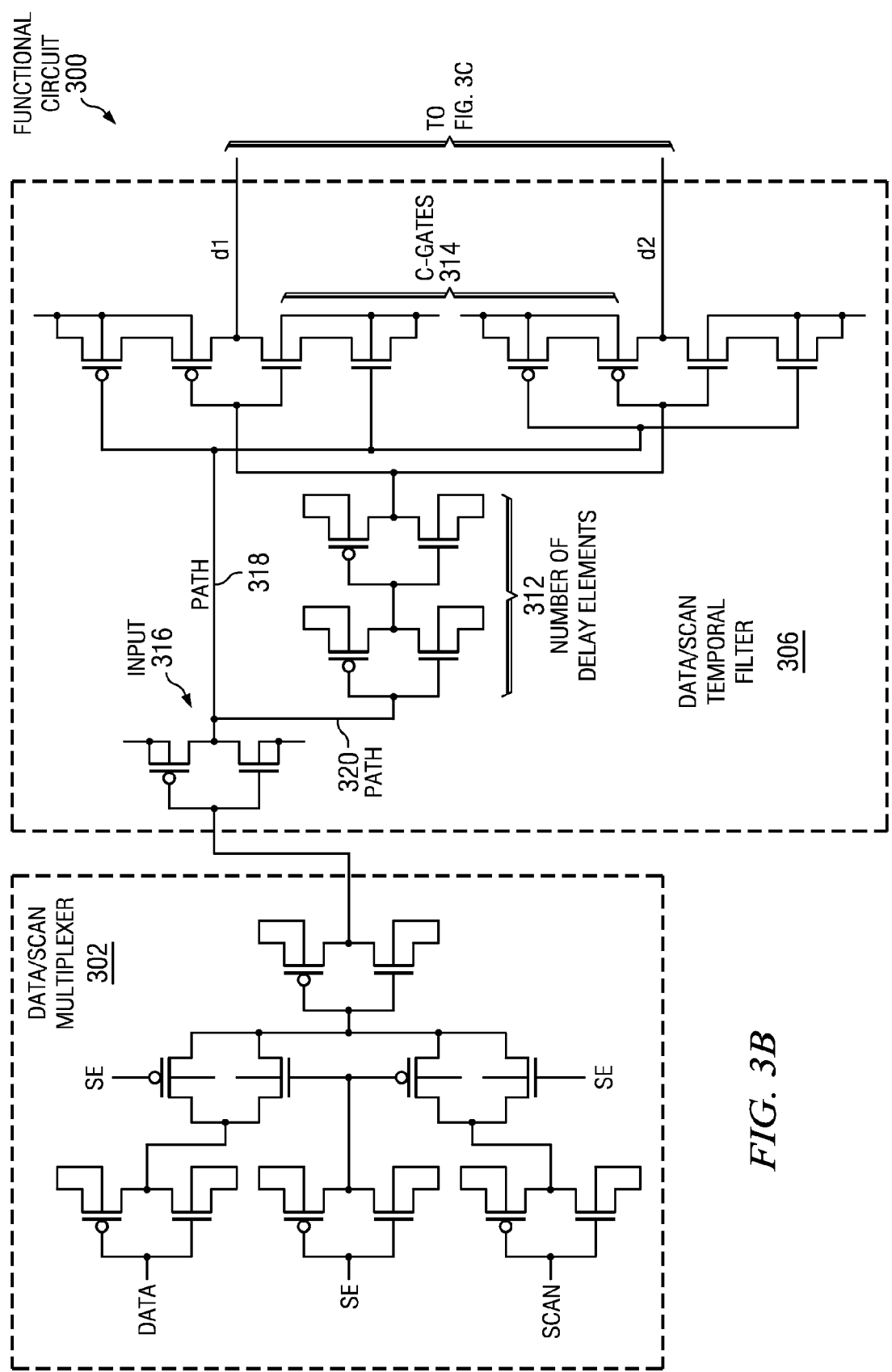
Figure 3C:
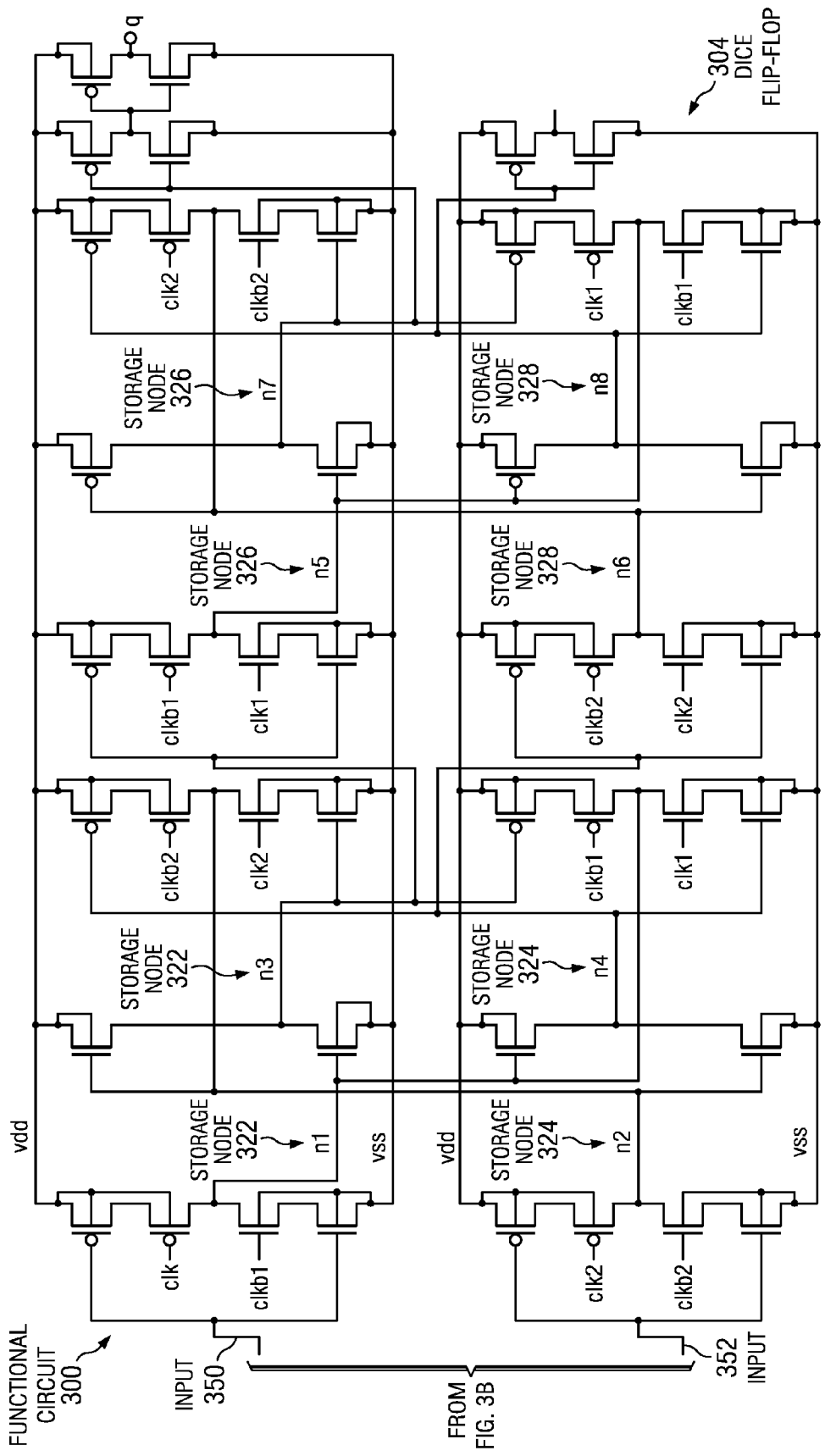

With reference now to FIGS. 3A, 3B, and 3C, an illustration of a functional circuit is depicted in accordance with an advantageous embodiment. Functional circuit 300 may be an example of one implementation of integrated circuit 200 in FIG. 2.

Functional circuit 300 includes data/scan multiplexer 302 depicted in FIG. 3B, dual interlocked storage cell (DICE) flip-flop 304 depicted in FIG. 3C, data/scan temporal filter 306 depicted in FIG. 3B, clock temporal filter 308 depicted in FIG. 3A, and clock 310 depicted in FIG. 3A. Data/scan multiplexer 302 may be any type of device that performs multiplexing. Dual interlocked storage cell (DICE) flip-flop 304 may be any kind of electronic circuit which has two stable states and can store one bit of information, such as a bi-stable multivibrator for example. Dual interlocked storage cell (DICE) flip-flop 304 includes storage node 322, storage node 324, storage node 326, and storage node 328, as depicted in FIG. 3C. Storage node 322, storage node 324, storage node 326, and storage node 328 are each formed of multiple circuit nodes. Storage node 322 and storage node 324 are comprised of jointly sensitive nodes. In a dual interlocked storage cell (DICE) flip-flop there are multiple pairs of circuit nodes that may cause the dual interlocked storage cell (DICE) flip-flop to upset if both circuit nodes experience a particle strike at the same time. The physical distance between a pair of upsettable circuit nodes is called critical node spacing. The pair of upsettable circuit nodes may be referred to as jointly sensitive nodes.

Data/scan temporal filter 306 includes number of delay elements 312 and C-gates 314, as depicted in FIG. 3B. Number of delay elements 312 may include, for example, without limitation, an inverter, a current-starved inverter, a pass gate, and/or any other suitable delay element. C-gates 314 may be any type of tristatable inverter, including, without limitation, complementary metal oxide semiconductor(CMOS) tristatable inverter, n-channel metal oxide semiconductor (NMOS) tristatable inverter, p-channel metal oxide semiconductor (PMOS) tristatable inverter, and/or any other suitable tristatable inverter, for example.

Data/scan temporal filter 306 is physically located between storage node 322 and storage node 324 to increase critical node spacing. Increasing critical node spacing reduces the probability that single radiation particles will affect both storage node 322 and storage node 324. Placing data/scan temporal filter 306 between the two jointly sensitive nodes increases critical node spacing and decreases the single event upset rate. Incorporating the temporal filters in dual interlocked storage cell (DICE) flip-flop 304 allows the area of the temporal filters to be used for critical node spacing to decrease single event upset sensitivity. Clock temporal filter 308 is physically located between storage node 326 and storage node 328 to increase critical node spacing for storage nodes 326 and 328.

Turning to FIG. 3B, input 316 is received from data/scan multiplexer 302 and split into two paths by data/scan temporal filter 306. Path 318 sends the signal received directly to C-gates 314. Path 320 sends the signal received through number of delay elements 312 before the signal reaches C-gates 314. As a result, two outputs result from the single input 316 into data/scan temporal filter 306. C-gates 314 send the two outputs to inputs 350 and 352 of dual interlocked storage cell (DICE) flip-flop 304 depicted in FIG. 3C, which connect to storage nodes of dual interlocked storage cell (DICE) flip-flop 304, such as storage node 322 and storage node 324 for example.

Turning back to FIG. 3A, in one advantageous embodiment, clock temporal filter 308 receives clock input from clock 310 before the clock input reaches dual interlocked storage cell (DICE) flip-flop 304. Clock temporal filter 308 may include number of delay elements 330 and C-gates 332.

The illustration of functional circuit 300 in FIGS. 3A, 3B, and 3C is not meant to imply physical or architectural limitations to the manner in which different advantageous embodiments may be implemented. Other components in addition and/or in place of the ones illustrated may be used. Some components may be unnecessary in some advantageous embodiments. Also, the blocks are presented to illustrate some functional components. One or more of these blocks may be combined and/or divided into different blocks when implemented in different advantageous embodiments.

For example, in one advantageous embodiment, functional circuit 300 may be implemented without clock temporal filter 308. In another advantageous embodiment, functional circuit 300 may be implemented with a scannable DICE master-slave flip-flop, where the master stage consists of a transient tolerant, scannable DICE latch with a data/scan multiplexer, and a second temporal filter in the clock input, and the slave stages consists of a DICE latch. In yet another advantageous embodiment, functional circuit 300 may be implemented with a non-scannable master-slave flip-flop without data/scan multiplexer 302, for example. In still another advantageous embodiment, functional circuit 300 may be implemented with a transient-tolerant, scannable DICE latch that is not part of a master/slave flip-flop, for example.

Figure 4:
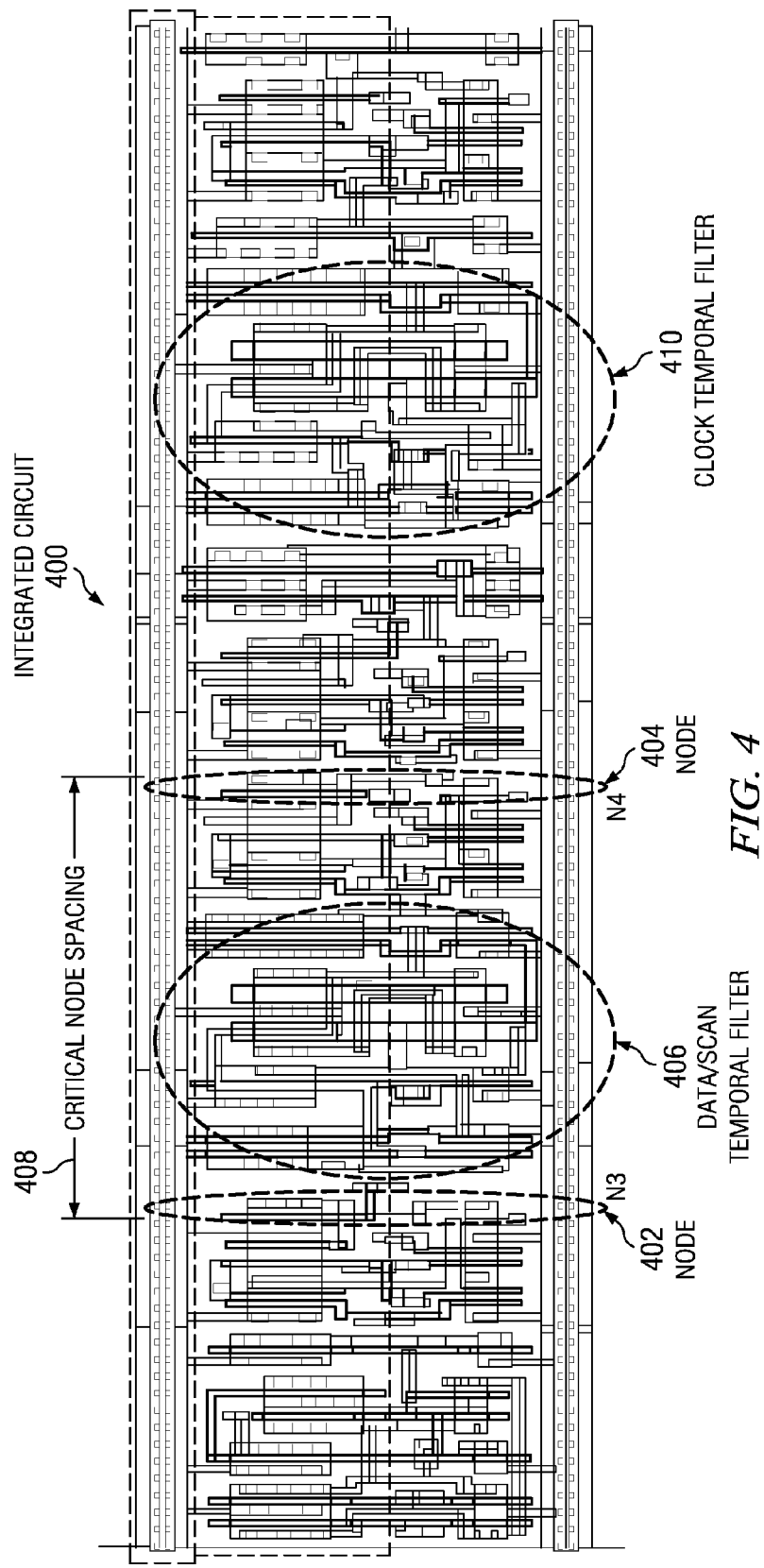
FIG. 4 is an illustration of an integrated circuit in accordance with an advantageous embodiment.

With reference now to FIG. 4, an illustration of an integrated circuit is depicted in accordance with an advantageous embodiment. Integrated circuit 400 may be an example of one implementation of integrated circuit 200 in FIG. 2 and/or functional circuit 300 in FIGS. 3A, 3B, and 3C.

Integrated circuit 400 depicts node 402 and node 404. Node 402 and node 404 may be an example of one implementation of two storage nodes of a DICE flip-flop, such as storage node 322 and storage node 324 of dual interlocked storage cell (DICE) flip-flop 304 in FIG. 3C. Node 402 and node 404 may be jointly sensitive nodes separated by critical node spacing 408. Node 402 and node 404 may be jointly sensitive because they are circuit nodes that may cause a dual interlocked storage cell (DICE) flip-flop to upset if both node 402 and node 404 experience a particle strike at the same time. Data/scan temporal filter 406 is physically located between node 402 and node 404, providing critical node spacing 408. Critical node spacing 408 mitigates the possibility of a single event effect to one of nodes 402 and 404 affecting the other node at the same time. In an advantageous embodiment, integrated circuit 400 may also include clock temporal filter 410.

The illustration of integrated circuit 400 in FIG. 4 is not meant to imply physical or architectural limitations to the manner in which different advantageous embodiments may be implemented. Other components in addition and/or in place of the ones illustrated may be used. Some components may be unnecessary in some advantageous embodiments. Also, the blocks are presented to illustrate some functional components. One or more of these blocks may be combined and/or divided into different blocks when implemented in different advantageous embodiments. For example, in one advantageous embodiment, integrated circuit 400 may be implemented without clock temporal filter 410.

Figure 5:
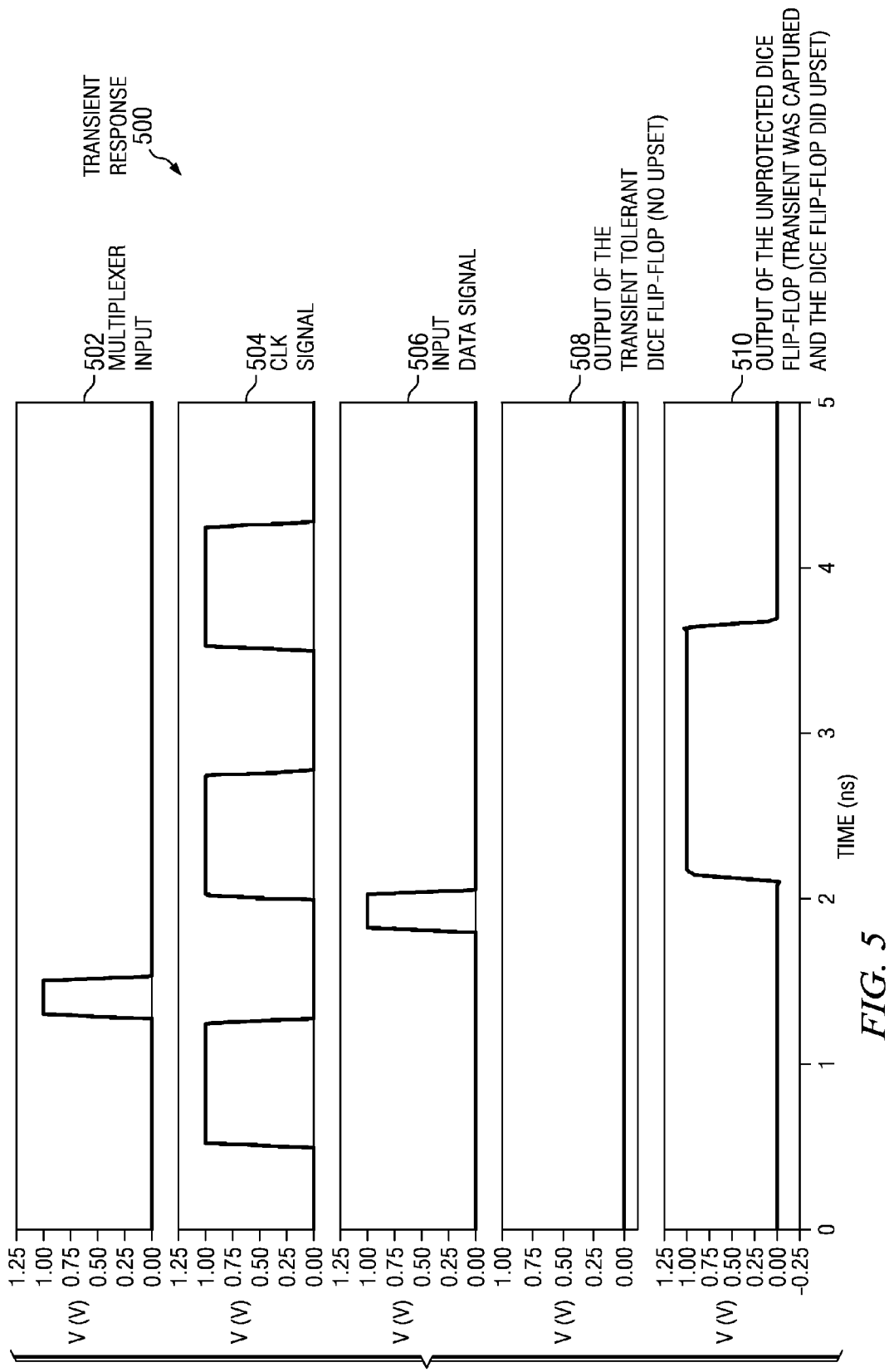
FIG. 5 is an illustration of a transient response in accordance with an advantageous embodiment.

FIG. 5 is an illustration of a transient response in accordance with an advantageous embodiment. Transient response 500 may be implemented by an integrated circuit on a platform, such as integrated circuit 108 on platform 100 in FIG. 1, for example.

Multiplexer input 502 is an illustrative example of a data/scan input to a multiplexer, such as data/scan multiplexer 202 in FIG. 2 or data/scan multiplexer 302 in FIG. 3B. Clock signal 504 is an illustrative example of one implementation of clock signal 236 in FIG. 2. Clock signal 504 represents a dedicated clock signal that may be part of a time-discrete system, for example. Clock signal 504 may depict clocking, pulsing, or strobing, for example. A DICE flip-flop, such as dual interlocked storage cell (DICE) flip-flop 204 in FIG. 2, may store inputs at the transition of clock signal 504. The dual interlocked storage cell latch may store inputs at the rising edge or falling edge of clock signal 504.

Input data signal 506 is an illustrative example of a transient. Input data signal 506 depicts a transient that occurs between transitions of clock signal 504. Output of the transient tolerant DICE flip-flop 508 depicts the transient response of the advantageous embodiments, where the transient is not latched as an input because it is ignored. Output of the unprotected DICE flip-flop 510 depicts the transient response of a dual interlocked storage cell without the advantageous embodiments, where the transient was captured causing a single event upset. The transient response of a dual interlocked storage cell without the advantageous embodiments depicted in 510 illustrates the change in output based on the transient event.

The illustration of transient response 500 in FIG. 5 is not meant to imply physical or architectural limitations to the manner in which different advantageous embodiments may be implemented. Other components in addition and/or in place of the ones illustrated may be used. Some components may be unnecessary in some advantageous embodiments. Additionally, one or more of these components may be combined and/or divided into different components when implemented in different advantageous embodiments.

Figure 6:
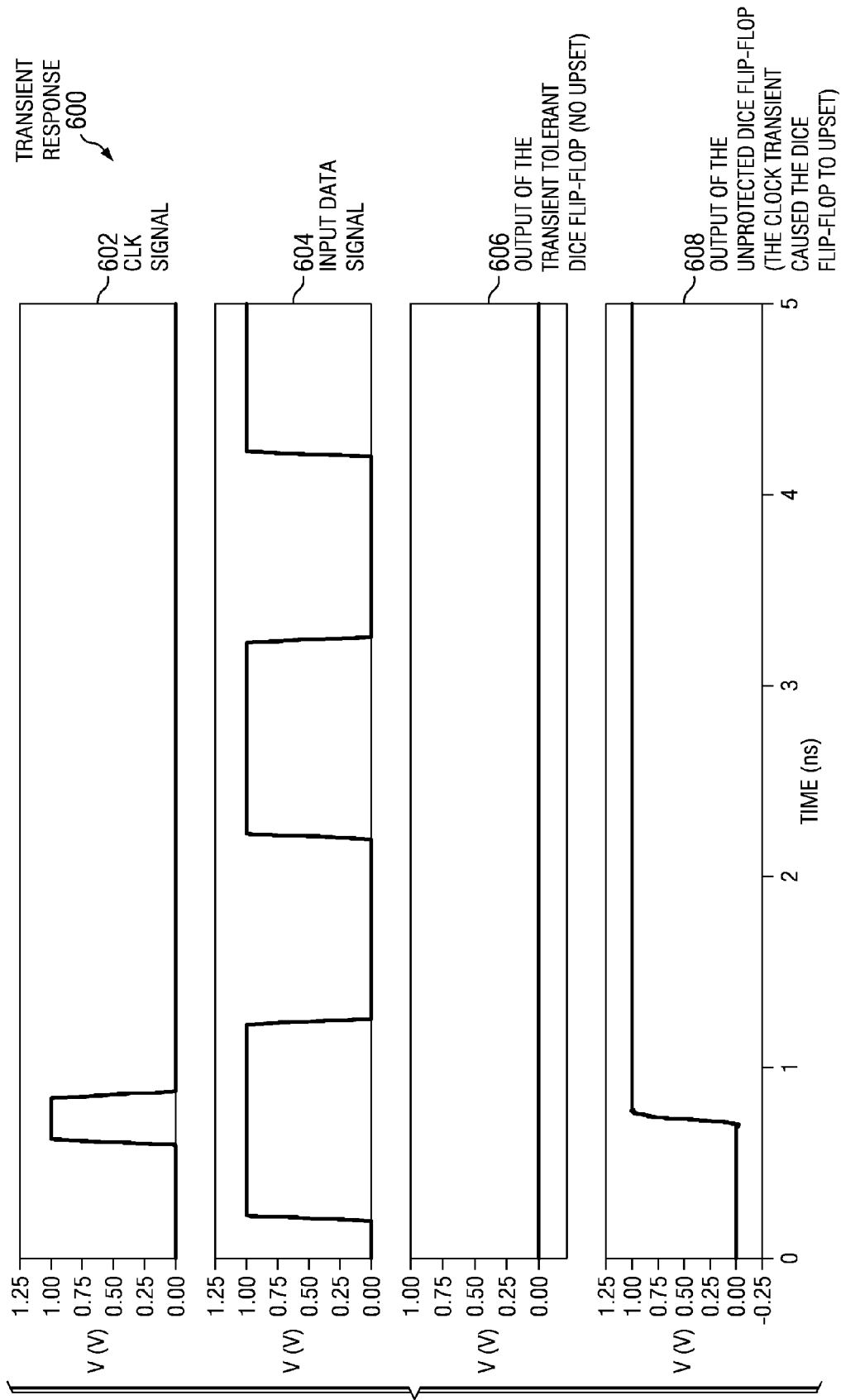
FIG. 6 is an illustration of a transient response in accordance with an advantageous embodiment.

FIG. 6 is an illustration of a transient response in accordance with an advantageous embodiment. Transient response 600 may be implemented by an integrated circuit on a platform, such as integrated circuit 108 on platform 100 in FIG. 1, for example.

Clock signal 602 is an illustrative example of a transient on clock signal 236 in FIG. 2. Clock signal 602 represents a dedicated clock signal that may be part of a time-discrete system, for example. A DICE flip-flop, such as dual interlocked storage cell (DICE) flip-flop 204 in FIG. 2, may store inputs at the transition of clock signal 602. The dual interlocked storage cell latch may store inputs at the rising edge or falling edge of clock signal 602.

Input data signal 604 is an illustrative example of the output of data/scan multiplexer 202 in FIG. 2. The switching input data signal 604 is not captured by the DICE flip flop when clock signal 602 is in a constant logical state. Output of the transient tolerant DICE flip-flop 606 depicts the transient response of the advantageous embodiments, where the clock transient is ignored and the input data signal is thus ignored. Output of the unprotected DICE flip-flop 608 depicts the transient response of a dual interlocked storage cell without the advantageous embodiments, where the clock transient caused the DICE flip-flop to capture the input data state, thereby causing a single event upset. The transient response of a dual interlocked storage cell without the advantageous embodiments depicted in 608 illustrates the change in output based on the transient event.

The illustration of transient response 600 in FIG. 6 is not meant to imply physical or architectural limitations to the manner in which different advantageous embodiments may be implemented. Other components in addition and/or in place of the ones illustrated may be used. Some components may be unnecessary in some advantageous embodiments. Additionally, one or more of these components may be combined and/or divided into different components when implemented in different advantageous embodiments.

Figure 7:
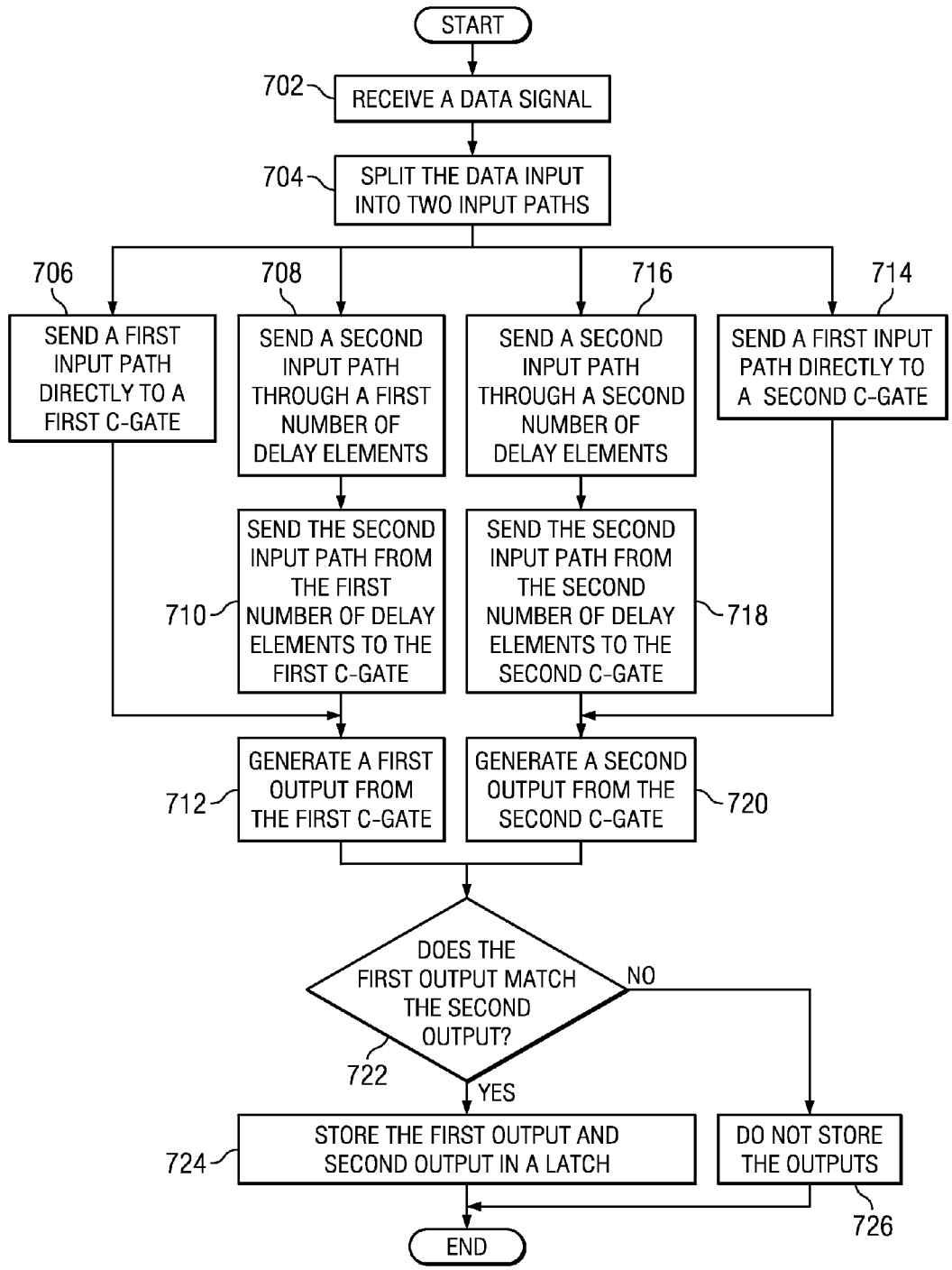
FIG. 7 is an illustration of a flowchart of a process for reducing data errors in accordance with an advantageous embodiment.

FIG. 7 is an illustration of a flowchart of a process for reducing data errors in accordance with an advantageous embodiment. The process in FIG. 7 may be implemented by a component such as integrated circuit 200 in FIG. 2 and/or functional circuit 300 in FIGS. 3A, 3B, and 3C.

The process begins by receiving a data input (operation 702). The data input is received from a multiplexer, such as data/scan multiplexer 202 in FIG. 2, for example. The process splits the data input into two input paths using a filter (operation 704). The filter may be, for example, data/scan temporal filter 206 in FIG. 2 or data/scan temporal filter 306 in FIG. 3B. The data input is split by the filter wiring of the data/scan temporal filter, depicted for example by path 318 and path 320 of input 316 in FIG. 3B.

The process sends a first input path directly to a first C-gate (operation 706). The process sends a second input path through a first number of delay elements (operation 708). The number of delay elements may be, for example, number of delay elements 212 in FIG. 2. The number of delay elements may be, for example, without limitation, an inverter, a current-starved inverter, a pass gate, and/or any other suitable delay element. The delay elements may be adjusted to change a time for the second input path to reach a first C-gate. In one illustrative example, the delay elements may be adjusted to a predetermined time delay during design of the integrated circuit. In another illustrative example, such as when implementing a current-starved inverter, the delay elements may be adjusted during operation of the integrated circuit. The process then sends the second input path from the first number of delay elements to the first C-gate (operation 710). The process then generates a first output from the first C-gate (operation 712).

Simultaneous to operation 706, 708, and 710, the process sends the first input path directly to a second C-gate (operation 714). The process sends the second input path through a second number of delay elements (operation 716), and sends the second input path from the second number of delay elements to the second C-gate (operation 718). The process then generates a second output from the second C-gate (operation 720). The first output from the first C-gate in operation 712 and the second output from the second C-gate in operation 720 are generated at the same time.

Next, the process determines whether the first output matches the second output (operation 722). If the determination is made that the first output does match the second output, the process stores the first output and the second output in a latch (operation 724), with the process terminating thereafter. The latch or DICE flip-flop will store data on storage nodes, such as storage nodes 322, 324, 326, and 328 of FIG. 3C, for example. If the determination is made that the first output and the second output do not match, the process does not store the outputs (operation 726).

The first output may be sent to a first storage node of a dual interlocked storage cell flip-flop, such as storage node 226 of dual interlocked storage cell (DICE) flip-flop 204 in FIG. 2. The second output may be sent to a second storage node, such as storage node 228 in FIG. 2. If the outputs match, the data may be stored or latched by the dual interlocked storage cell flip-flop.

Figure 8:
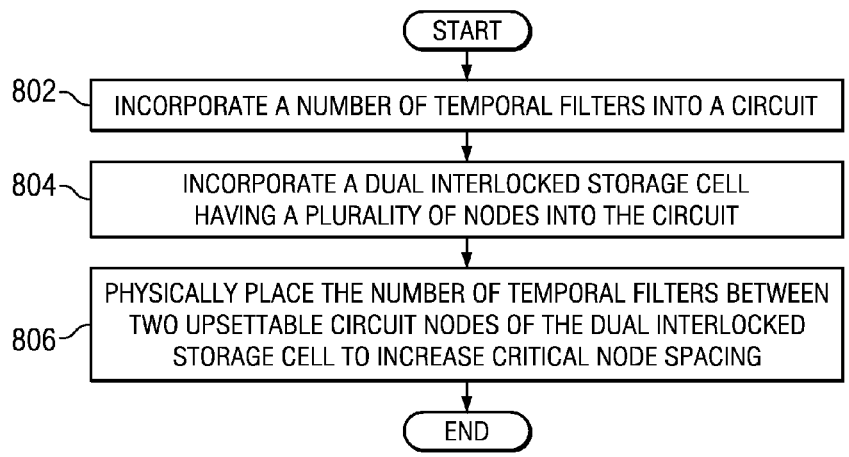
FIG. 8 is an illustration of a flowchart of a process for designing a circuit in accordance with an advantageous embodiment.

With reference now to FIG. 8, an illustration of a flowchart of a process for designing a circuit is depicted in accordance with an advantageous embodiment. The process in FIG. 8 may be implemented in an integrated circuit, such as integrated circuit 108 in FIG. 1, for example.

The process begins by incorporating a number of temporal filters into a circuit (operation 802). The process incorporates a dual interlocked storage cell having a plurality of nodes into the circuit (operation 804). The process then physically places the number of temporal filters between two upsettable circuit nodes of the dual interlocked storage cell to increase critical node spacing (operation 806), with the process terminating thereafter.

The flowcharts and block diagrams in the different depicted embodiments illustrate the architecture, functionality, and operation of some possible implementations of apparatus and methods in different advantageous embodiments. In this regard, each block in the flowchart or block diagrams may represent a module, segment, function, and/or a portion of an operation or step. In some alternative implementations, the function or functions noted in the block may occur out of the order noted in the figures. For example, in some cases, two blocks shown in succession may be executed substantially concurrently, or the blocks may sometimes be executed in the reverse order, depending upon the functionality involved.

The different advantageous embodiments recognize and take into account that currently used methods for reducing circuit sensitivity use spatial and temporal redundancy techniques. However, these current spatial redundancy schemes can be defeated by radiation particle events that affect multiple nodes. Additionally, current methods for solving signal integrity concerns from cross-talk, or transient noise, require separate and special tools that try to solve the noise glitches generated by cross coupled signals. As integrated circuit dimensions become smaller with the scaling of semiconductor processes to smaller lithographic nodes, cross-talk is a growing concern in current methods of reducing circuit sensitivity.

The different advantageous embodiments further recognize and take into account that the current methods for single event upset mitigation have power, speed, and area penalties. Power is a critical integrated circuit parameter, as it impacts operating costs through electricity use and the required cooling techniques. Furthermore, in space applications, available power may be limited. Additionally, current methods of inserting temporal filters post-synthesis complicate the design flow of complex integrated circuits.

Thus, the different advantageous embodiments provide a transient-tolerant dual interlocked storage cell latch with increased radiation tolerance that is easy to implement. The different advantageous embodiments protect against radiation particle strikes to C-gates of a temporal filter and a multiplexer that would be unprotected in current methods where the temporal filter is external to the dual interlocked storage cell. The different advantageous embodiments provide a method for increasing node spacing of jointly sensitive nodes to further reduce single event upset sensitivity using temporal filters. When the temporal filters are incorporated in the dual interlocked storage cells, the parasitic loads are controlled. The different advantageous embodiments provide a method and apparatus that avoids problems arising from post-synthesis filter insertion and mitigates transients within a stand-alone cell.

The description of the different advantageous embodiments has been presented for purposes of illustration and description, and is not intended to be exhaustive or limited to the embodiments in the form disclosed. Many modifications and variations will be apparent to those of ordinary skill in the art. Further, different advantageous embodiments may provide different advantages as compared to other advantageous embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

What is claimed is:

1. An integrated circuit comprising:
    a number of dual interlocked storage cell flip-flops, wherein each of the number of dual interlocked storage cell flip-flops has two inputs and four storage nodes, wherein the four storage nodes include a number of pairs of circuit nodes that form a number of upsettable circuit node pairs, and wherein a first two of the four storage nodes comprise a master dual interlocked storage cell latch and a second two of the four storage nodes comprise a slave dual interlocked storage cell latch; and
    a number of temporal filters having two outputs, wherein each of the two outputs is connected to two inputs of a dual interlocked storage cell flip-flop in the number of dual interlocked storage cell flip-flops, wherein each input of the two inputs is connected to a corresponding storage node in the first two storage nodes of the master dual interlocked storage cell latch of the dual interlocked storage cell flip-flop, and wherein the number of temporal filters is physically located between a pair of circuit nodes in the number of pairs of circuit nodes forming a number of upsettable circuit node pairs within the dual interlocked storage cell flip-flop to increase critical node spacing.

2. The integrated circuit of claim 1, further comprising: a number of temporal filters connected to a clock input.

3. The integrated circuit of claim 1, wherein the number of temporal filters further comprises:
    a number of delay elements; and
    a number of C-gates.

4. The integrated circuit of claim 3, wherein the number of delay elements are selected from at least one of an inverter, a current-starved inverter, and a pass gate.

5. The integrated circuit of claim 3, wherein the number of delay elements are configured to be adjusted, and wherein adjusting the number of delay elements changes a time for a signal to reach the number of C-gates.

6. The integrated circuit of claim 1, further comprising:
    a multiplexer configured to send selected input to the number of temporal filters.

7. The integrated circuit of claim 1, wherein the number of temporal filters is configured to receive input from a multiplexer.

* * * * *